(12) United States Patent
Nawano

(10) Patent No.: US 8,746,855 B2
(45) Date of Patent: Jun. 10, 2014

(54) METHOD FOR MANUFACTURING PIEZOELECTRIC ELEMENT, PIEZOELECTRIC ELEMENT, LIQUID EJECTING HEAD, AND LIQUID EJECTING APPARATUS

(75) Inventor: Masahisa Nawano, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1 day.

(21) Appl. No.: 13/429,103

(22) Filed: Mar. 23, 2012

(65) Prior Publication Data

US 2012/0242755 A1    Sep. 27, 2012

(30) Foreign Application Priority Data

Mar. 24, 2011    (JP) .................................. 2011-066812

(51) Int. Cl.
*B41J 2/045*    (2006.01)

(52) U.S. Cl.
USPC .......................... 347/68; 38/71; 38/72; 38/70

(58) Field of Classification Search
USPC ...................................................... 347/68–72
See application file for complete search history.

(56) References Cited

U.S. PATENT DOCUMENTS

2008/0074473 A1*    3/2008    Takabe et al. ................... 347/70
2011/0220734 A1*    9/2011    Yonemura et al. ......... 239/102.2

FOREIGN PATENT DOCUMENTS

JP    2009-252789    10/2009

* cited by examiner

*Primary Examiner* — Henok Legesse
(74) *Attorney, Agent, or Firm* — Workman Nydegger

(57) ABSTRACT

A piezoelectric element is manufactured in a method including forming an adhesion layer of zirconium above a zirconium oxide insulating film, forming a first electrode above the adhesion layer, forming a piezoelectric layer of a complex oxide containing bismuth above the first electrode, and forming a second electrode above the piezoelectric layer.

6 Claims, 12 Drawing Sheets

FIG. 12    NO SEPARATION
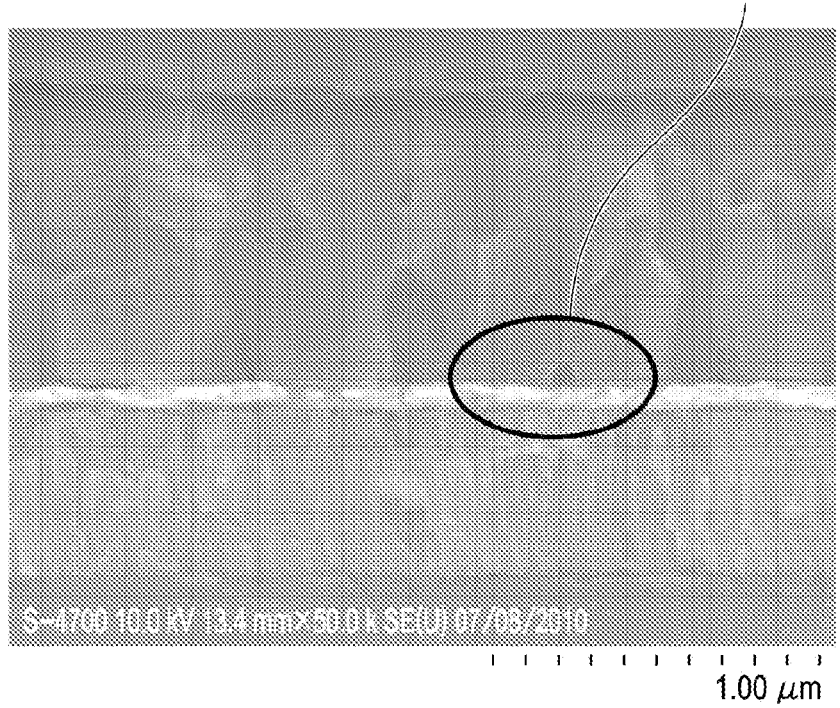
1.00 μm
FIG. 13    SEPARATION AT Pt/TiOx INTERFACE (BY DETERIORATION LAYER ON TiOx LAYER)
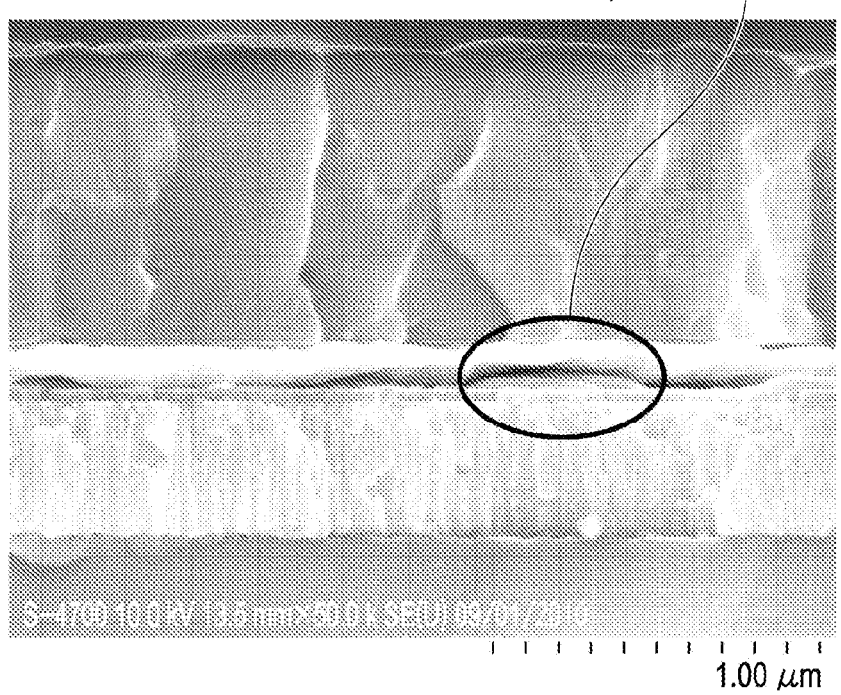
1.00 μm

METHOD FOR MANUFACTURING PIEZOELECTRIC ELEMENT, PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2011-066812, filed Mar. 24, 2011 is expressly incorporated by reference.

BACKGROUND

1. Technical Field

The present invention relates to a method for manufacturing a piezoelectric element, and to a piezoelectric element, a liquid ejecting head and a liquid ejecting apparatus.

2. Related Art

Ink jet recording heads are a typical type of liquid ejecting head. An ink jet recording head includes a vibration plate defining a part of a pressure generating chamber communicating with nozzle apertures through which ink droplets are ejected. In the ink jet recording head, a piezoelectric element deforms the vibration plate to apply a pressure to the ink in the pressure generating chamber, thereby ejecting ink droplets through the nozzle apertures. Some of the piezoelectric elements used in ink jet recording heads have a structure in which a piezoelectric layer made of a piezoelectric material capable of electromechanical conversion, such as a piezoelectric ceramic, is disposed between two electrodes. This type of piezoelectric element is used as a deflection vibration mode actuator device in a liquid ejecting head.

A liquid ejecting head has been known which uses lead zirconate titanate (PZT) having a high displacement property as a piezoelectric ceramic. However, lead zirconate titanate contains lead. From the viewpoint of environmental protection, lead-free piezoelectric materials are desired.

Accordingly, piezoelectric materials have been developed which do not contain lead, but have piezoelectric properties equal to PZT. For example, piezoelectric materials having a bismuth ferrate-based ($BiFeO_3$-based) perovskite structure containing bismuth and iron have been proposed. JP-A-2009-252789 discloses an example of such materials which is a complex oxide expressed as a mixed crystal of bismuth ferrate manganate such as $Bi(Fe,Mn)O_3$ and barium titanate such as $BaTiO_3$. Piezoelectric materials containing an alkali metal have also been developed, such as bismuth sodium titanate ($BiNaTiO_3$, hereafter simply referred to as BNT).

Lead-free bismuth-containing piezoelectric materials are promising as an alternative to PZT. However, if a piezoelectric element is formed using such a bismuth-containing piezoelectric material, bismuth in the material is likely to diffuse into the electrodes, thereby causing film separation.

More specifically, if a bismuth-based piezoelectric layer is formed after a first electrode of platinum or the like has been formed on an insulating layer of, for example, zirconium oxide with a titanium oxide adhesion layer therebetween, as with PZT piezoelectric elements, the bismuth in the piezoelectric layer diffuses into the first electrode and, further, precipitates out at the interface between the first electrode and the underlying adhesion layer. This precipitate causes undesired film separation. If the adhesion layer contains titanium, the titanium diffuses into the first electrode and further into the piezoelectric layer simultaneously with the diffusion of bismuth into the first electrode. Consequently, the properties of the piezoelectric layer are undesirably degraded.

In any case, it is difficult to produce a high-performance piezoelectric element including a piezoelectric layer that is made of a lead-free bismuth-based piezoelectric material and maintains an adhesion with the underlying layer.

Other types of liquid ejecting heads have the described disadvantages. Not only ink jet heads, but also piezoelectric elements used in other devices, such as ultrasonic devices, in addition to elements used in liquid ejecting heads, have the described disadvantages.

SUMMARY

An advantage of some aspects of the invention is that it provides a method for manufacturing a lead-free piezoelectric element in which film separation does not occur and whose piezoelectric properties are not degraded much, and provides the piezoelectric element, a liquid ejecting head and a liquid ejecting apparatus.

According to an aspect of the invention, a method for manufacturing a piezoelectric element is provided. In the method, an adhesion layer is formed of zirconium on a zirconium oxide insulating film, and a first electrode is formed on the adhesion layer. A piezoelectric layer is formed of a complex oxide containing bismuth on the first electrode, and a second electrode is formed on the piezoelectric layer.

In this embodiment, the zirconium adhesion layer ensures the adhesion between the insulating film and the first electrode, and, in addition, suppresses the precipitation of bismuth diffusing from the piezoelectric layer and the degradation of the piezoelectric properties resulting from diffusion into the piezoelectric layer from the adhesion layer. Thus, the method can produce a piezoelectric element in which film separation or the like does not occur and whose piezoelectric properties are not degraded.

Preferably, the adhesion layer is formed to a thickness of 10 to 20 nm. Thus, a high adhesion can be achieved between the first electrode and the insulating film.

Preferably, the first electrode is formed of at least one of platinum and iridium. Thus, a highly conductive first electrode can be formed, and, in addition, the bismuth-based piezoelectric layer can exhibit superior piezoelectric properties.

According to another aspect of the invention, a piezoelectric element is provided which includes an insulating film made of zirconium oxide, an adhesion layer containing zirconium on the insulating film, a first electrode on the adhesion layer, a piezoelectric layer made of a complex oxide containing bismuth on the first electrode, and a second electrode on the piezoelectric layer.

In this embodiment, the zirconium adhesion layer ensures the adhesion between the insulating film and the first electrode and, in addition, suppresses the precipitation of bismuth diffusing from the piezoelectric layer and the degradation of the piezoelectric properties resulting from diffusion into the piezoelectric layer from the adhesion layer. Accordingly, in the piezoelectric element, film separation or the like does not occur, and the piezoelectric properties are not degraded.

The adhesion layer may contain zirconium and zirconium oxide. In such a piezoelectric element, film separation does not occur, and the piezoelectric properties are not degraded.

Preferably, the adhesion layer contains zirconium, zirconium oxide and bismuth. Consequently, even though bismuth having diffused from the piezoelectric layer is present in the adhesion layer, the bismuth does not precipitate out and, accordingly, does not cause film separation.

According to another aspect of the invention, a liquid ejection head including the above-described piezoelectric element is provided.

In this embodiment, the zirconium adhesion layer of the piezoelectric element ensures the adhesion between the insulating film and the first electrode, and, in addition, suppresses the precipitation of bismuth diffusing from the piezoelectric layer and the degradation of the piezoelectric properties resulting from diffusion into the piezoelectric layer from the adhesion layer. Accordingly, in the piezoelectric element of the liquid ejecting head, film separation or the like does not occur, and the piezoelectric properties of the piezoelectric element are not degraded.

Furthermore, a liquid ejection apparatus including the liquid ejection head is provided.

In this embodiment, the liquid ejecting head of the liquid ejecting apparatus includes a piezoelectric element in which film separation does not occur and whose piezoelectric properties are not degraded.

BRIEF DESCRIPTION OF THE DRAWINGS

The invention will be described with reference to the accompanying drawings, wherein like numbers reference like elements.

FIG. 12 is a scanning electron micrograph of the Example.

FIG. 13 is a scanning electron micrograph of Comparative Example 2.

DESCRIPTION OF EXEMPLARY EMBODIMENTS

Exemplary Embodiment

Figure 1:
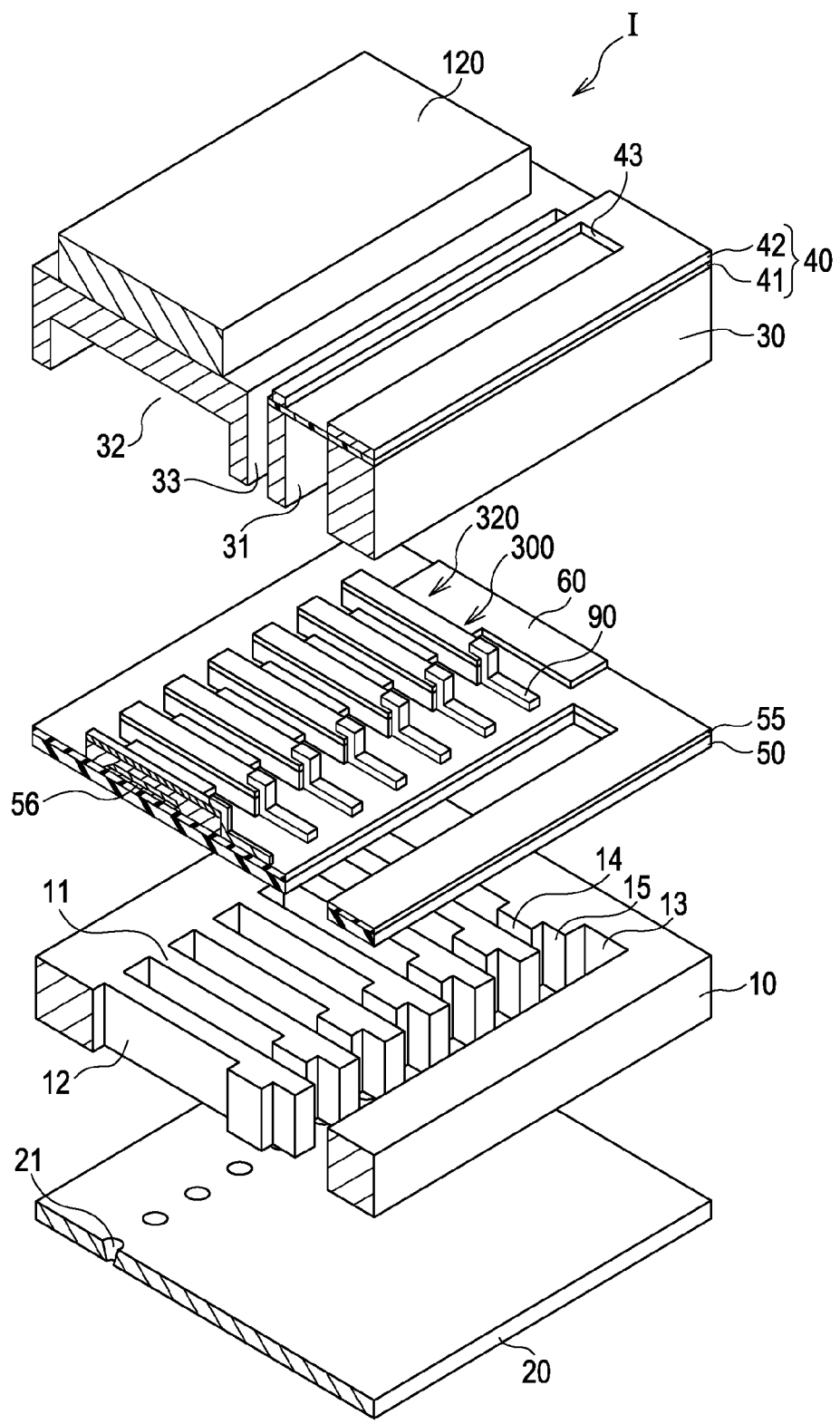
FIG. 1 is a schematic exploded perspective view of a recording head according to an embodiment of the invention.
Figure 2:
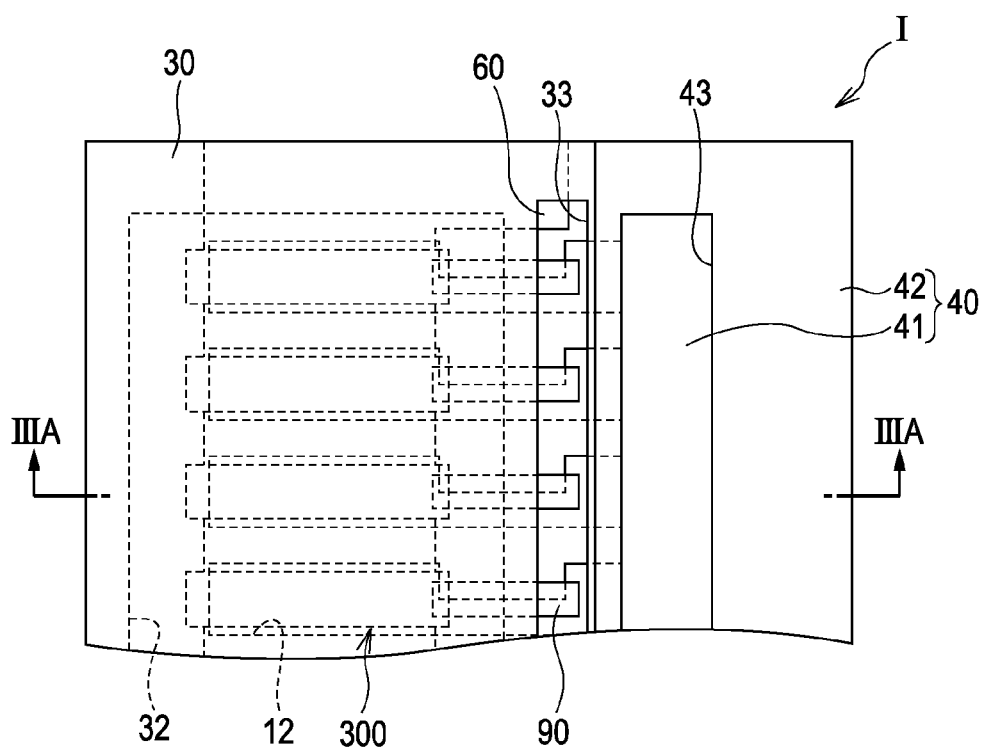
FIG. 2 is a plan view of the recording head according to the embodiment.
Figure 3A:
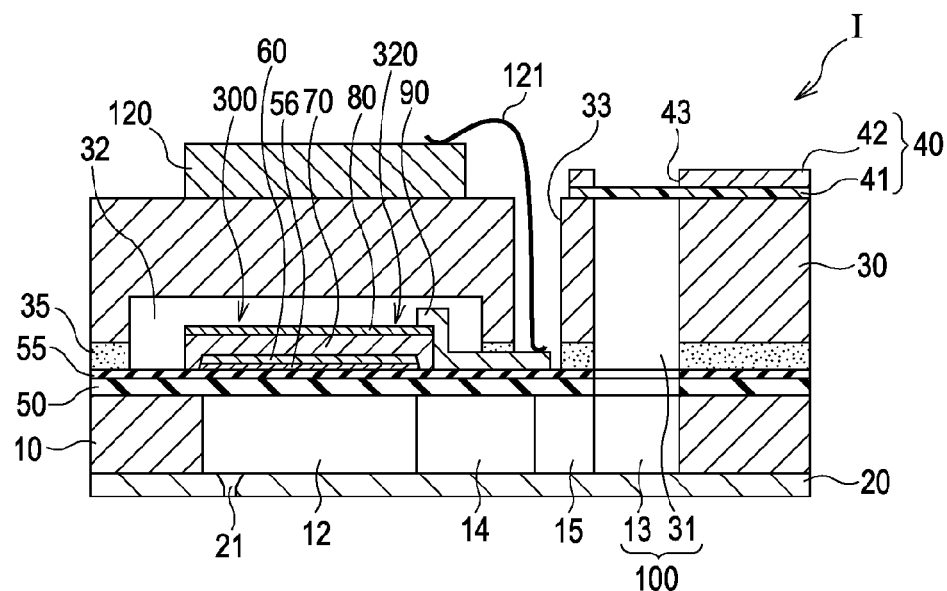
FIG. 3A is a sectional view of the recording head according to the embodiment.
Figure 3B:
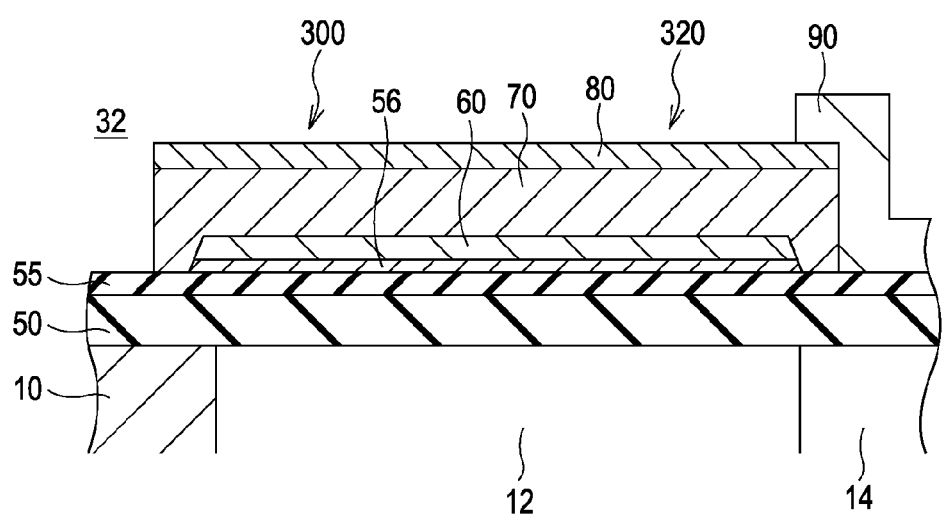
FIG. 3B is a fragmentary enlarged view of the sectional view shown in FIG. 3A.

FIG. 1 is a schematic exploded perspective view of an ink jet recording head I, which is a type of liquid ejecting head, according to an embodiment of the invention. FIG. 2 is a plan view of the ink jet recording head I shown in FIG. 1. FIGS. 3A and 3B are a sectional view taken along line III-III shown in FIG. 2, and a fragmentary enlarged view of a major portion in the sectional view. A flow channel substrate 10 is made of monocrystalline silicon, and a silicon dioxide elastic film 50 is disposed on one surface of the flow channel substrate 10, as shown in FIGS. 1 to 3B.

The flow channel substrate 10 has a plurality of pressure generating chambers 12 arranged in parallel. The direction in which the pressure generating chambers 12 are arranged refers to a parallel arrangement direction or a first direction. The flow channel substrate 10 also has a communicating section 13 therein located outside the pressure generating chambers 12 in a second direction perpendicular to the parallel arrangement direction. The communicating section 13 communicates with the pressure generating chambers 12 through corresponding ink supply channels 14 and communication paths 15. The communicating section 13 communicates with a manifold section 31 formed in a protective substrate (described later) to define a part of a manifold acting as a common ink chamber of the pressure generating chambers 12. Each ink supply channel 14 has a smaller width than the pressure generating chamber 12, so that the flow channel resistance of the ink delivered to the pressure generating chamber 12 from the communicating section 13 is kept constant. Although the ink supply channels 14 are formed by narrowing the flow channels from one side in the present embodiment, the flow channels may be narrowed from both sides in another embodiment. Alternatively, the ink supply channels 14 may be formed by reducing the depth of the flow channels, instead of narrowing the flow channels. In the present embodiment, the flow channel substrate 10 has liquid flow channels including the pressure generating chambers 12, the communicating section 13, the ink supply channels 14 and the communication paths 15.

The flow channel substrate 10 is joined to a nozzle plate 20 at the open side thereof with an adhesive, a thermal fusion film or the like. The nozzle plate 20 has nozzle apertures 21 communicating with the end portions of the corresponding pressure generating chambers 12 on the opposite side to the ink supply channels 14. The nozzle plate 20 can be made of, for example, glass-ceramic, monocrystalline silicon or stainless steel.

On the other side of the flow channel substrate 10, opposite to the open side of the, an elastic film 50 is disposed. The elastic film 50 may be made of silicon dioxide. On the elastic film 50, a zirconium oxide insulating film 55 having a thickness of 100 to 400 nm is disposed. An adhesion layer 56 having a thickness of 10 to 20 nm is disposed on the insulating film 55.

Furthermore, piezoelectric elements 300 are disposed on the adhesion layer 56. Each piezoelectric element 300 has a multilayer structure including a first electrode 60, a piezoelectric layer 70 having a small thickness of 2 μm or less, preferably 1 to 0.3 μm, above the first electrode 60, and a second electrode 80 above the piezoelectric layer 70. The phrase "above" mentioned herein means that it may be disposed on something directly or with another member therebetween. The piezoelectric element 300 mentioned herein refers to the portion including the first electrode 60, the piezoelectric layer 70 and the second electrode 80. In general, either of the electrodes of the piezoelectric element 300 acts as a common electrode, and the other electrode and the piezoelectric layer 70 are formed for each pressure generating chamber 12 by patterning. The electrode and piezoelectric layer 70 formed by patterning define a piezoelectric active portion 320 at which piezoelectric strain is caused by applying a current to both electrodes. Although in the present embodiment, the first electrode 60 acts as the common electrode of the piezoelectric elements 300 and the second electrode 80 is provided as discrete electrodes of the piezoelectric elements 300, the functions of the first and second electrodes may be reversed for the sake of convenience of arrangement of the driving circuit and wiring. In the present embodiment, the piezoelectric element 300 disposed in a displaceable manner refers to an actuator device. Although in the present embodiment, the elastic film 50, the insulating film 55, the adhesion layer 56 and the first electrode 60 act as a vibration plate, the structure of the vibration plate is not limited to this, and the elastic film 50 and the adhesion layer 56 are not necessarily provided. The piezoelectric element 300 may double as a vibration plate.

The adhesion layer 56 is defined by a layer containing zirconium formed by sputtering, and will be described in detail later. The adhesion layer 56 can enhance the adhesion between the zirconium oxide insulating film 55 and the first electrode 60 and prevent film separation.

The first electrode 60 is made of at least one of platinum (Pt) and iridium (Ir). The first electrode 60 may be a multi-layer composite including layers containing at least these two materials.

The piezoelectric layer 70 on the first electrode 60 is made of a lead-free piezoelectric ceramic of a complex oxide having a perovskite structure containing bismuth. Examples of such a complex oxide include bismuth ferrate ($BiFeO_3$, hereinafter abbreviated as BFO), bismuth ferrate manganate ($Bi(Fe,Mn)O_3$, hereinafter abbreviated as BFMO), bismuth sodium titanate (for example, $(Bi,Na)TiO_3$, hereinafter abbreviated as BNT), bismuth potassium titanate (for example, $(Bi,K)TiO_3$, hereinafter abbreviated as BKT), compounds prepared by adding other elements to these oxides, and mixed crystals of these complex oxides and barium titanate (for example, $BaTiO_3$, hereinafter abbreviated as BT).

The first electrode 60 is formed of platinum or the like on the zirconium adhesion layer 56 formed on the zirconium oxide insulating film 55 by sputtering, and this will be described in detail later in the section describing the manufacturing method. Consequently, even if bismuth in the piezoelectric layers 70 diffuses into the first electrode 60 and further into the adhesion layer 56, the bismuth does not precipitate out nor cause film separation. In addition, zirconium in the adhesion layer 56 does not diffuse into the piezoelectric layer 70, and thus the piezoelectric properties are not degraded.

The second electrode 80 of each piezoelectric element 300 is connected with a lead electrode 90 made of, for example, gold (Au) extending from one end at the ink supply channel 14 side of the second electrode 80 to the surface of the insulating film 55.

A protective substrate 30 having a manifold section 31 defining at least part of a manifold 100 is joined to the flow channel substrate 10 having the piezoelectric elements 300 with an adhesive 35 so as to cover the insulating film 55 and the lead electrodes 90. The manifold section 31 passes through the thickness of the protective substrate 30 and extends along the widths of the pressure generating chambers 12. Thus, the manifold section 31 communicates with the communicating section 13 of the flow channel substrate 10 to form the manifold 100 acting as the common ink chamber of the pressure generating chambers 12. The communicating section 13 of the flow channel substrate 10 may be divided for each pressure generating chamber 12, and only the manifold section 31 may serve as a manifold. Alternatively, the flow channel substrate 10 may have only the pressure generating chambers 12, and the manifold 100 and ink supply channels 14 communicating with the respective pressure generating chambers 12 are formed in a member, such as the elastic film 50 or the insulating film 55, between the flow channel substrate 10 and the protective substrate 30.

A piezoelectric element-protecting section 32 is disposed in the region of the protective substrate 30 opposing the piezoelectric elements 300. The Piezoelectric element-protecting section 32 has a space so that the piezoelectric elements 300 can operate without interference. It is intended that the space of the piezoelectric element-protecting section 32 is such a size that the piezoelectric elements 300 can operate, and the space may or may not be sealed.

Preferably, the protective substrate 30 is made of a material having substantially the same thermal expansion coefficient as the flow channel substrate 10, such as glass or ceramic. In the present embodiment, the protective substrate 30 is made of the same monocrystalline silicon as the flow channel substrate 10.

The protective substrate 30 has a through hole 33 passing through the thickness of the protective substrate 30. The ends of the lead electrodes 90 extending from the piezoelectric elements 300 are exposed in the through hole 33.

A driving circuit 120 is secured on the protective substrate 30 and drives the piezoelectric elements 300 arranged in parallel. The driving circuit 120 may be a circuit board, a semiconductor integrated circuit (IC) or the like. The driving circuit 120 is electrically connected to each lead electrode 90 with a conductive connection wire 121, such as bonding wire.

Furthermore, a compliance substrate 40 including a sealing film 41 and a fixing plate 42 is joined on the protective substrate 30. The sealing film 41 is made of a flexible material having a low rigidity, and seals one end of the manifold section 31. The fixing plate 42 is made of a relatively hard material. The portion of the fixing plate 42 opposing the manifold 100 is completely removed to form an opening 43; hence one end of the manifold 100 is closed with only the flexible sealing film 41.

The ink jet recording head I of the present embodiment draws an ink through an ink inlet connected to an external ink supply unit (not shown). The ink is delivered to fill the spaces from the manifold 100 to the nozzle apertures 21. Then, the ink jet recording head I applies a voltage between the first electrode 60 and each second electrode 80 corresponding to the pressure generating chambers 12, according to the recording signal from the driving circuit 120. Thus, the elastic film 50, the insulating film 55, the adhesion layer 56, the first electrode 60 and the piezoelectric layers 70 are deformed to increase the internal pressure in the pressure generating chambers 12, thereby ejecting the ink through the nozzle apertures 21.

A method for manufacturing the ink jet recording head according to the present embodiment will be described with reference to FIGS. 4A to 8B. FIGS. 4A to 8B are sectional views of the pressure generating chamber taken in the second direction.

Figure 4A:
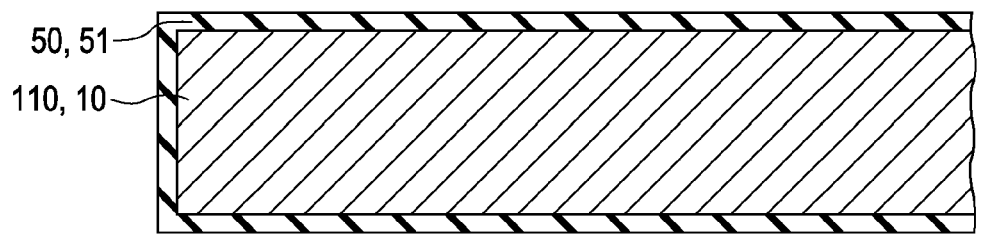
FIGS. 4A and 4B are sectional views showing a manufacturing process of the recording head according to the embodiment.

As shown in FIG. 4A, a silicon dioxide ($SiO_2$) film is formed for an elastic film 50 by thermal oxidation or the like on the surface of a silicon wafer 110 for flow channel substrates.

Figure 4B:
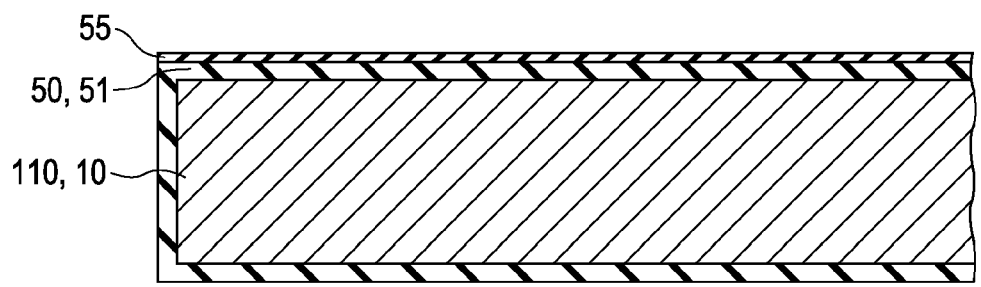

Subsequently, an insulating film 55 is formed of zirconium oxide on the elastic film 50, as shown in FIG. 4B. The insulating film may be formed by thermal oxidation of a zirconium film formed by sputtering, or by reactive sputtering of zirconium oxide.

Figure 5A:
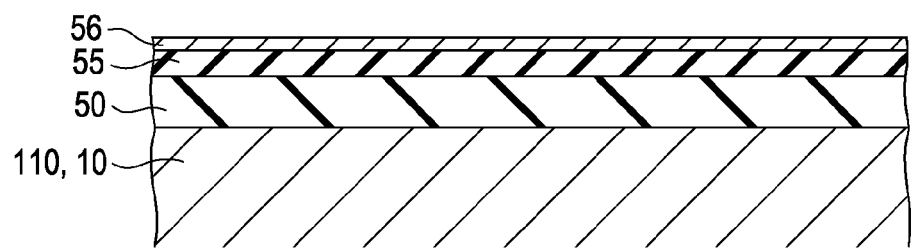
FIGS. 5A to 5C are sectional views showing the manufacturing process of the recording head.

Then, an adhesion layer 56 is formed on the insulating film 55 by, in the present embodiment, DC sputtering, as shown in FIG. 5A. The adhesion layer can be formed to a thickness of 10 to 20 nm. Although the thickness in this range is sufficient to produce the advantageous effects of the invention, the thickness may be larger than this range.

Figure 5B:
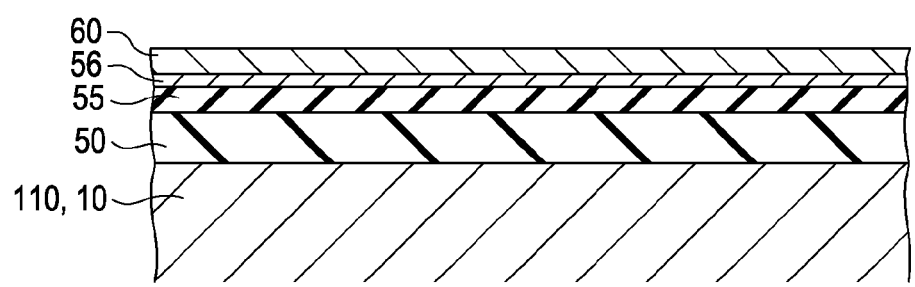

Subsequently, a platinum (Pt) first electrode 60 is formed on the adhesion layer 56, as shown in FIG. 5B. The first electrode 60 can be formed by sputtering or vapor deposition.

Figure 5C:
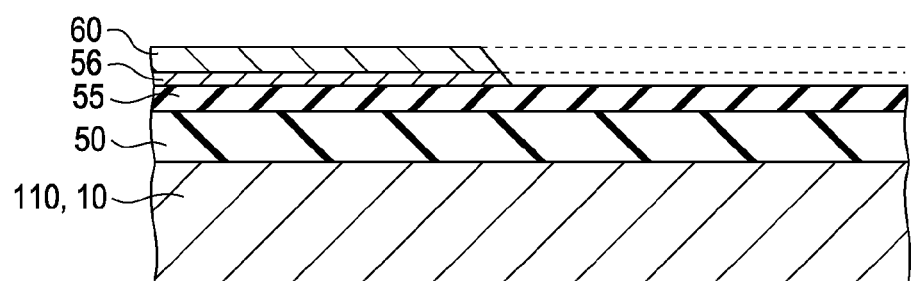

Then, the first electrode 60 and the adhesion layer 56 are simultaneously patterned through a resist mask having a predetermined shape formed over the first electrode, as shown in FIG. 5C.

Subsequently, a piezoelectric layer 70 is formed of a bismuth-based piezoelectric ceramic constituted of a bismuth-containing complex oxide on the first electrode 60. In the present embodiment, a mixed crystal of bismuth ferrate manganate $Bi(Fe,Mn)O_3$ and barium titanate $BaTiO_3$ is used as the bismuth-based piezoelectric ceramic. The piezoelectric layer 70 can be formed by a chemical solution method, such as a sol-gel method or metal-organic decomposition (MOD), or by sputtering. In the present embodiment, the piezoelectric layer 70 is formed by MOD. Even though the piezoelectric layer 70 of the present embodiment is formed by a solution coating method such as MOD, bismuth diffusing from the piezoelectric layer 70 does not precipitate out between the insulating film 55 and the first electrode 60. Thus, the adhesion between the insulating film 55 and the first electrode 60 can be maintained. In addition, since the adhesion layer 56 is made of zirconium, the constituents of the adhesion layer can be prevented from diffusing into the piezoelectric layer 70. Thus, the piezoelectric properties of the piezoelectric layer 70 are not degraded.

Figure 6A:
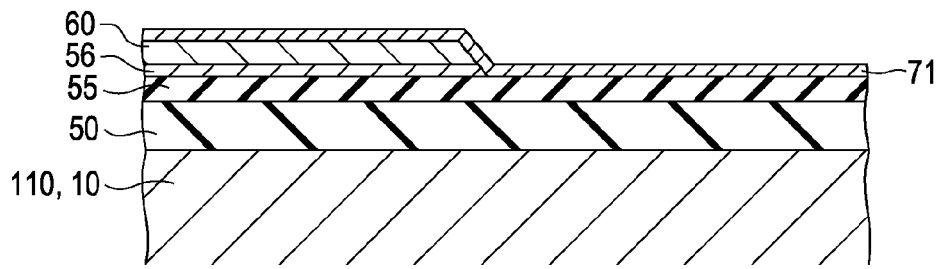
FIGS. 6A to 6C are sectional views showing the manufacturing process of the recording head.

A specific process of the manufacturing method will be described below. As shown in FIG. 6A, a coating solution containing bismuth ferrate manganate (BFMO) and barium titanate (BT) is applied onto a flow channel substrate 10 having a first electrode 60 thereon by spin coating, thus forming a piezoelectric precursor film 71 (coating operation).

The piezoelectric precursor film 71 is then heated to a predetermined temperature to be dried for a certain time (drying operation). For example, the piezoelectric precursor film 71 is dried by being allowed to stand at a temperature of 150 to 180° C. for 2 to 10 minutes.

Then, the dried piezoelectric precursor film 71 is further heated to a predetermined temperature and allowed to stand for a certain time to be degreased (degreasing). In the present embodiment, the piezoelectric precursor film 71 is degreased by, for example, being heated to a temperature of about 300 to 450° C. and allowed to stand at that temperature for 2 to 10 minutes. The degreasing mentioned herein is performed to convert organic components in the piezoelectric precursor film 71 into, for example, $NO_2$, $CO_2$ or $H_2O$ and thus to remove the organic components.

Figure 6B:
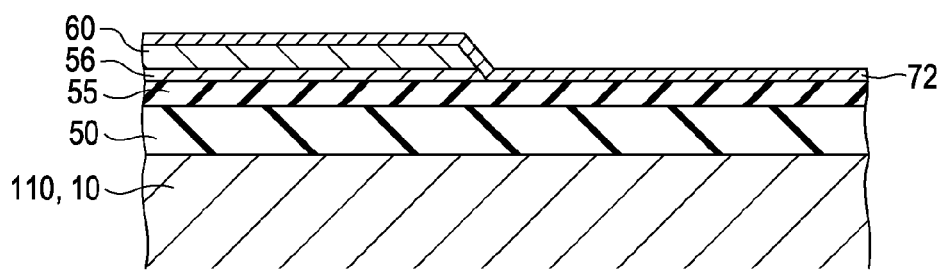

Then, as shown in FIG. 6B, the piezoelectric precursor film 71 is heated to a predetermined temperature, for example, to about 750 to 850° C., and allowed to stand for a certain time, thus being crystallized to form a piezoelectric film 72 (firing operation). This firing operation may be performed in any atmosphere without particular limitation, and may be performed in the air or an inert gas atmosphere.

The heating apparatus used for the drying, degreasing and firing operations may be a rapid thermal annealing (RTA) apparatus using an infrared lamp for heating, or a hot plate.

Figure 6C:
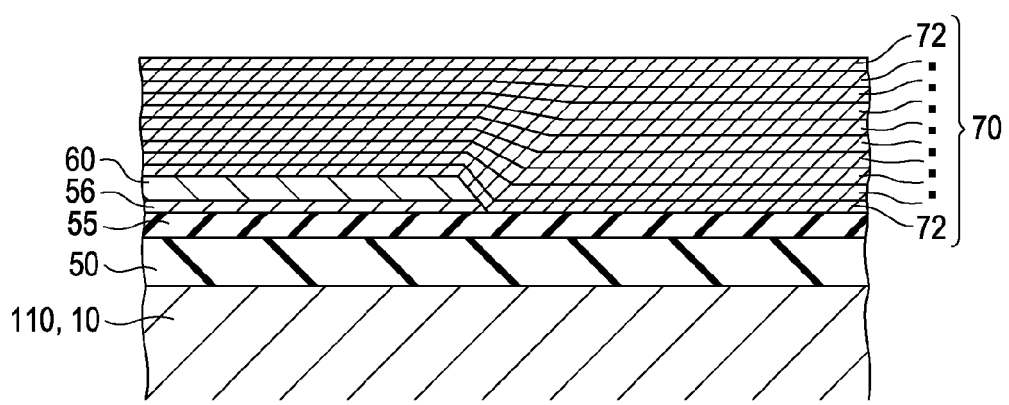

Subsequently, the sequence of operations for coating, drying and degreasing, or the sequence of operations for coating, drying, degreasing and firing is repeated several times according to the desired thickness. Thus a piezoelectric layer 70 having a desired thickness including a plurality of piezoelectric films 72 is formed, as shown in FIG. 6C. If, for example, a coating formed by a single operation for applying a coating solution has a thickness of about 0.1 µm, the piezoelectric layer 70 including 10 piezoelectric films 72 has a total thickness of about 1.1 µm. Although a plurality of piezoelectric films 72 are layered in the present embodiment, the piezoelectric layer 70 may include only a single piezoelectric film 72 in another embodiment.

It has been confirmed that bismuth diffuses from the piezoelectric layer 70 into the first electrode 60 and then into the interface between the first electrode 60 and the adhesion layer 56 or part of the adhesion layer 56 by heat treatment of the piezoelectric layer 70, and that zirconium in the adhesion layer 56, which diffuses into the first electrode 60 to some extent, does not diffuse into the piezoelectric layer 70. Therefore, it is supposed that in the adhesion layer 56, part of the zirconium is finally oxidized to form a layer containing zirconium and zirconium oxide or a layer containing zirconium and zirconium oxide and further bismuth. In this instance, the bismuth is probably present in the form of elemental bismuth or in a partially oxidized state.

Figure 7A:
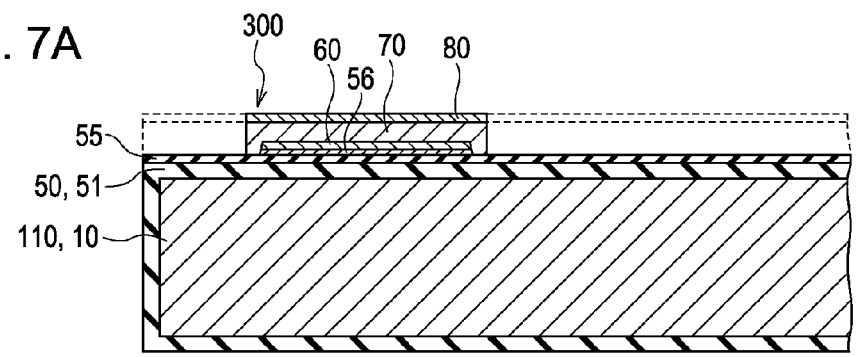
FIGS. 7A to 7C are sectional views showing the manufacturing process of the recording head.

After the piezoelectric layer 70 is formed, a layer for second electrodes 80 is formed of platinum on the piezoelectric layer 70 by sputtering or the like, and this layer and the piezoelectric layer 70 are simultaneously patterned so as to form piezoelectric elements 300, each including the first electrode 60, the piezoelectric layer 70 and the second electrode 80, in regions opposing the pressure generating chambers 12, as shown in FIG. 7A. The patterning of the piezoelectric layer 70 and the second electrode 80 can be performed at one time by dry etching through a resist layer (not shown) having a predetermined shape. Post-annealing may be performed at a temperature in the range of 600 to 800° C., if necessary, before or after forming the layer for the second electrodes 80. Thus, favorable interfaces can be formed between the piezoelectric layer 70 and the first electrode 60 and between the piezoelectric layer 70 and the second electrode 80, and, in addition, the crystallinity of the piezoelectric layer 70 can be enhanced.

Figure 7B:
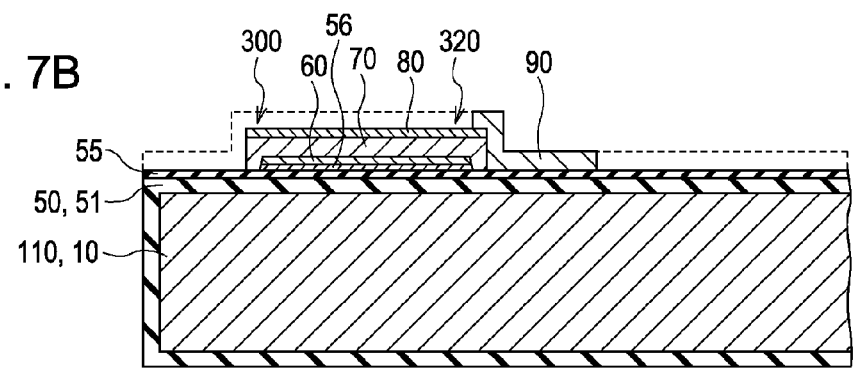

Then, a film is formed of, for example, gold (Au), over the entire surface of the flow channel substrate wafer 110, and is patterned into lead electrodes 90 for each piezoelectric element 300, as shown in FIG. 7B, through a mask pattern (not shown) made of, for example, a resist.

Figure 7C:
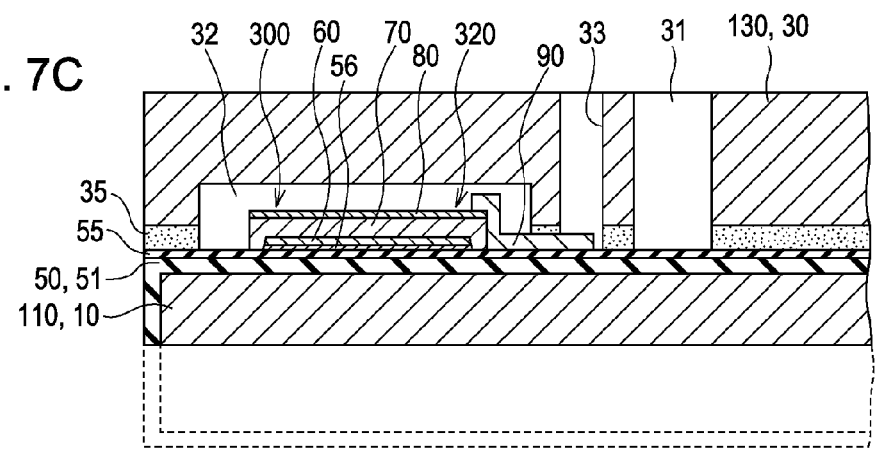

Then, a silicon protective substrate wafer 130 for a plurality of protective substrates 30 is bonded to the piezoelectric element 300 side of the flow channel substrate wafer 110 with an adhesive 35, and the thickness of the flow channel substrate wafer 110 is reduced to a predetermined level, as shown in FIG. 7C.

Figure 8A:
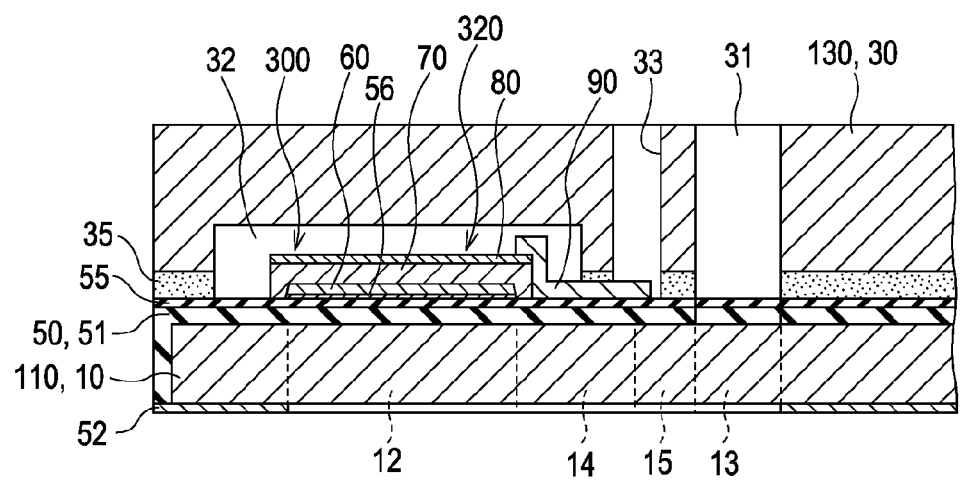
FIGS. 8A and 8B are sectional views showing the manufacturing process of the recording head.

Turning to FIG. 8A, a mask layer is formed on the surface of the flow channel substrate wafer 110 opposite the protective substrate wafer 130 and is patterned into a mask 52 having a predetermined shape.

Figure 8B:
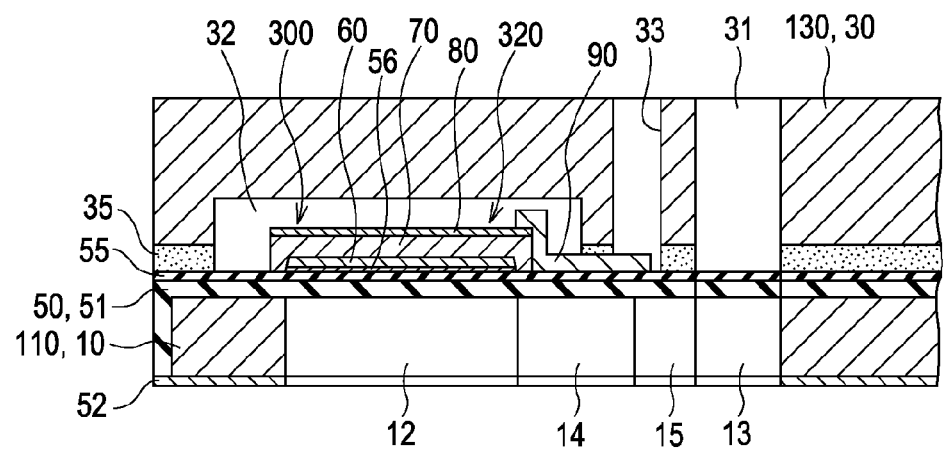

Subsequently, as shown in FIG. 8B, the flow channel substrate wafer 110 is subjected to anisotropic etching (wet etching) using an alkaline solution, such as KOH, through the mask 52 to form the pressure generating chambers 12 corresponding to the piezoelectric elements 300, the communicating section 13, the ink supply channels 14 and the communication paths 15 therein.

Then, unnecessary outer portions of the flow channel substrate wafer 110 and protective substrate wafer 130 are cut off by, for example, dicing. Subsequently, a nozzle plate 20 having nozzle apertures 21 therein is joined to the surface of the flow channel substrate wafer 110 opposite the protective substrate wafer 130 after the mask 52 has been removed, and a compliance substrate 40 is joined to the protective substrate wafer 130. The flow channel substrate wafer 110 joined to other substrates is cut into chips as shown in FIG. 1, each including a flow channel substrate 10 and other members. Thus, the ink jet recording head I of the present embodiment is completed.

EXAMPLE

A 1300 nm thick silicon dioxide elastic film 50 was formed by thermally oxidizing a (110) plane-oriented monocrystalline silicon substrate. Subsequently, zirconium (Zr) was deposited on the elastic film 50 by sputtering and was then heated at about 900° C., thus forming a 400 nm thick zirconium oxide insulating film 55.

Then, an adhesion layer 56 was formed of Zr to a thickness of 20 nm on the insulating film 55 by DC sputtering, and subsequently, a first electrode 60 was formed of Pt to a thickness of 130 nm on the adhesion layer 56 by DC sputtering.

Then, piezoelectric layers 70 were formed. In the Example, a film for the piezoelectric layers 70 was formed by spin coating of a precursor solution (coating solution) for forming a $Bi(Fe,Mn)O_3$—$BaTiO_3$ film (hereafter expressed as BFMO-BT film). The $Bi(Fe,Mn)O_3$:$BaTiO_3$ ratio in the composition of the solution was 75:25. For forming a desired thickness, spin coating was performed first at 500 rpm for 5 seconds, and then at 2500 rpm for 20 seconds. The resulting coating was dried at 180° C. for 2 minutes and then degreased at 350° C. for 3 minutes. Then, the above sequence of the operations from the coating to the degreasing was repeated three times. Then, the resulting structure was fired at 750° C. for 5 minutes in a rapid thermal annealing (RTA) apparatus in which oxygen flowed at 100 ccm. The sequence of the operations until the firing was repeated four times, and thus a BFMO-BT thin film was formed.

Comparative Example 1

An elastic film and an insulating film were formed on a monocrystalline silicon substrate in the same manner as in the Example.

Then, a Ti film was formed to a thickness of 20 nm on the insulating film 55 by DC sputtering, and subsequently, a first electrode was formed of Pt to a thickness of 130 nm on the Ti film by DC sputtering.

Then, a piezoelectric thin layer was formed in the same manner as in the Example.

Comparative Example 2

An elastic film and an insulating film were formed on a monocrystalline silicon substrate in the same manner as in the Example.

Then, a Ti film was formed to a thickness of 20 nm on the insulating film 55 by DC sputtering. Subsequently, the Ti film was thermally oxidized at 700° and, thus, a 40 nm thick $TiO_x$ film was formed. A first electrode was formed of Pt to a thickness of 130 nm on the $TiO_x$ film by DC sputtering.

Then, a piezoelectric thin layer was formed in the same manner as in the Example.

SIMS Observation

Figure 9:
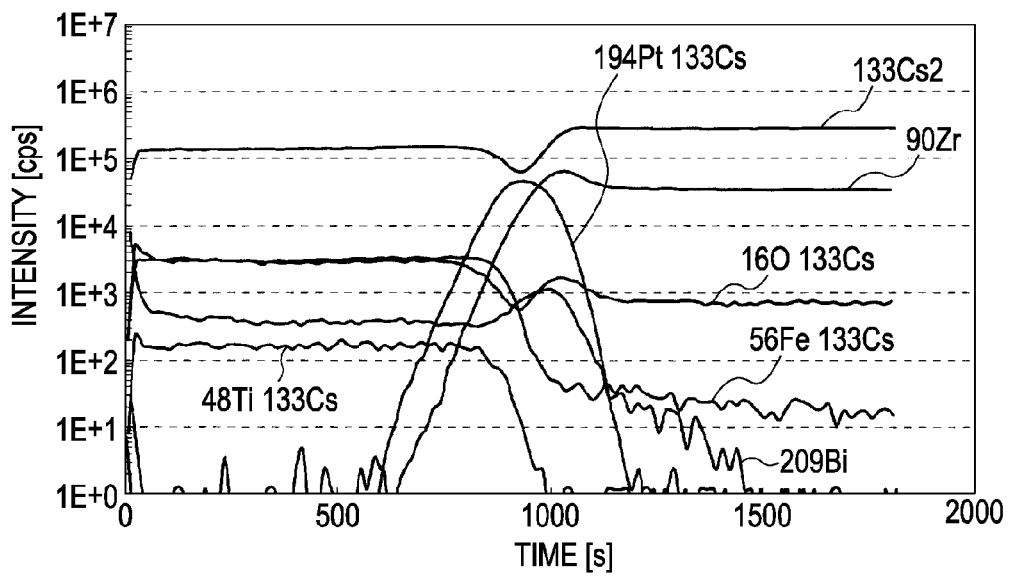
FIG. 9 is a plot of the composition depth profile of the Example measured by SIMS.
Figure 10:
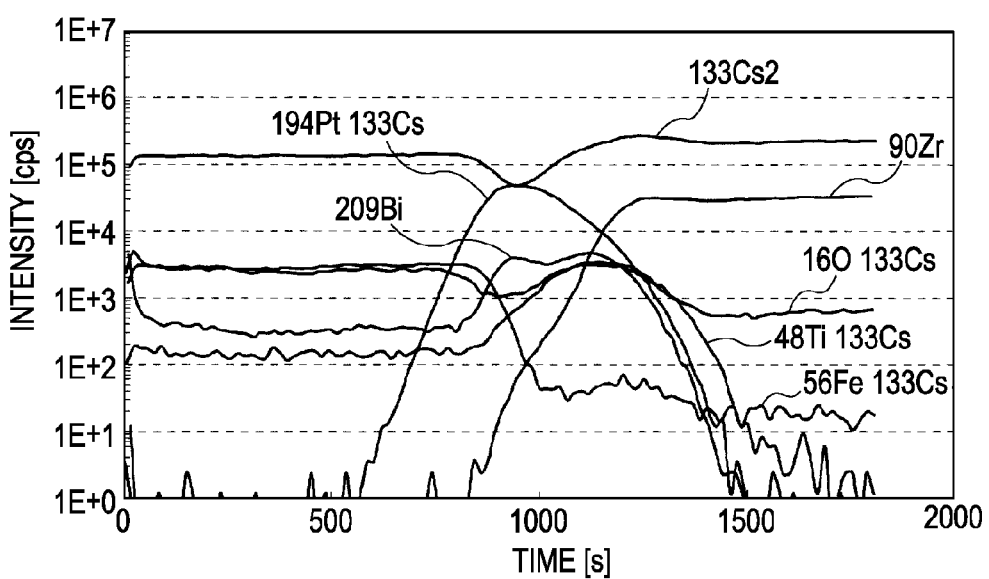
FIG. 10 is a plot of the composition depth profile of Comparative Example 1 measured by SIMS.
Figure 11:
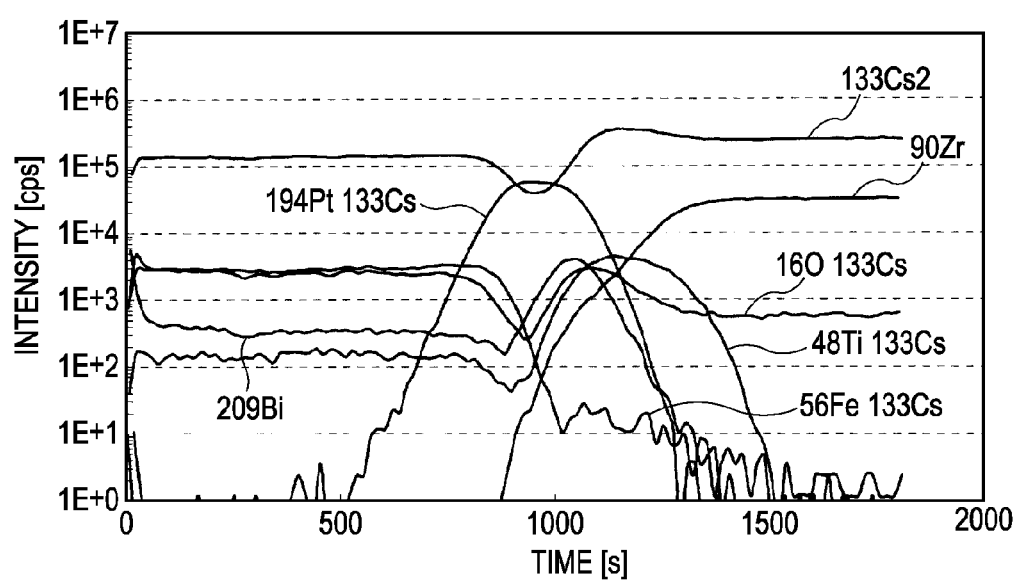
FIG. 11 is a plot of the composition depth profile of Comparative Example 2 measured by SIMS.

The compositional depth profiles of the Example and the Comparative Examples were measured with a secondary ion mass spectrometer (SIMS) IMS-7f manufactured by CAMECA Instruments. The results are shown in FIGS. 9 to 11. The composition depth profiles shown in the figures are normalized to 133Cs.

The results show that in Comparative Example 1, titanium diffused into the platinum first electrode and further into the piezoelectric layer, while bismuth diffused considerably into the first electrode from the piezoelectric layer. The diffusion of titanium probably causes the degradation of the piezoelectric layer.

It has also been found that in Comparative Example 2, while titanium did not diffuse from the titanium oxide layer, a large amount of bismuth diffused from the piezoelectric layer into the first electrode and up to the interface between the first electrode and the titanium oxide layer. This is probably the cause of the formation of a deterioration layer that will cause film separation.

On the other hand, in the Example, although bismuth diffused from the piezoelectric layer into the first electrode and up to the interface between the first electrode and the adhesion layer or part of the adhesion layer, the degree of the bismuth diffusion was smaller than in the Comparative Examples. In addition, the zirconium in the zirconium adhesion layer diffused into the first electrode to some extent, but did not into the piezoelectric layer.

Film Separation

The film separation in the Example and Comparative Example 2 was observed through a scanning electron microscope (SEM). The results are shown in FIGS. 12 and 13.

In Comparative Example 2, film separation was observed, and a deterioration layer was also observed at the boundary between the titanium oxide layer and the first electrode in the portion in which the film separation occurred. In contrast, film separation or a deterioration layer was not observed in the Example.

Other Embodiments

Although an exemplary embodiment of the invention has been described, the invention is not limited to the disclosed embodiment. For example, in the above embodiment, a monocrystalline silicon substrate is used as the flow channel substrate 10. However, the flow channel substrate 10 may be made of, for example, silicon-on-insulator (SOI) or glass, without particular limitation.

Figure 14:
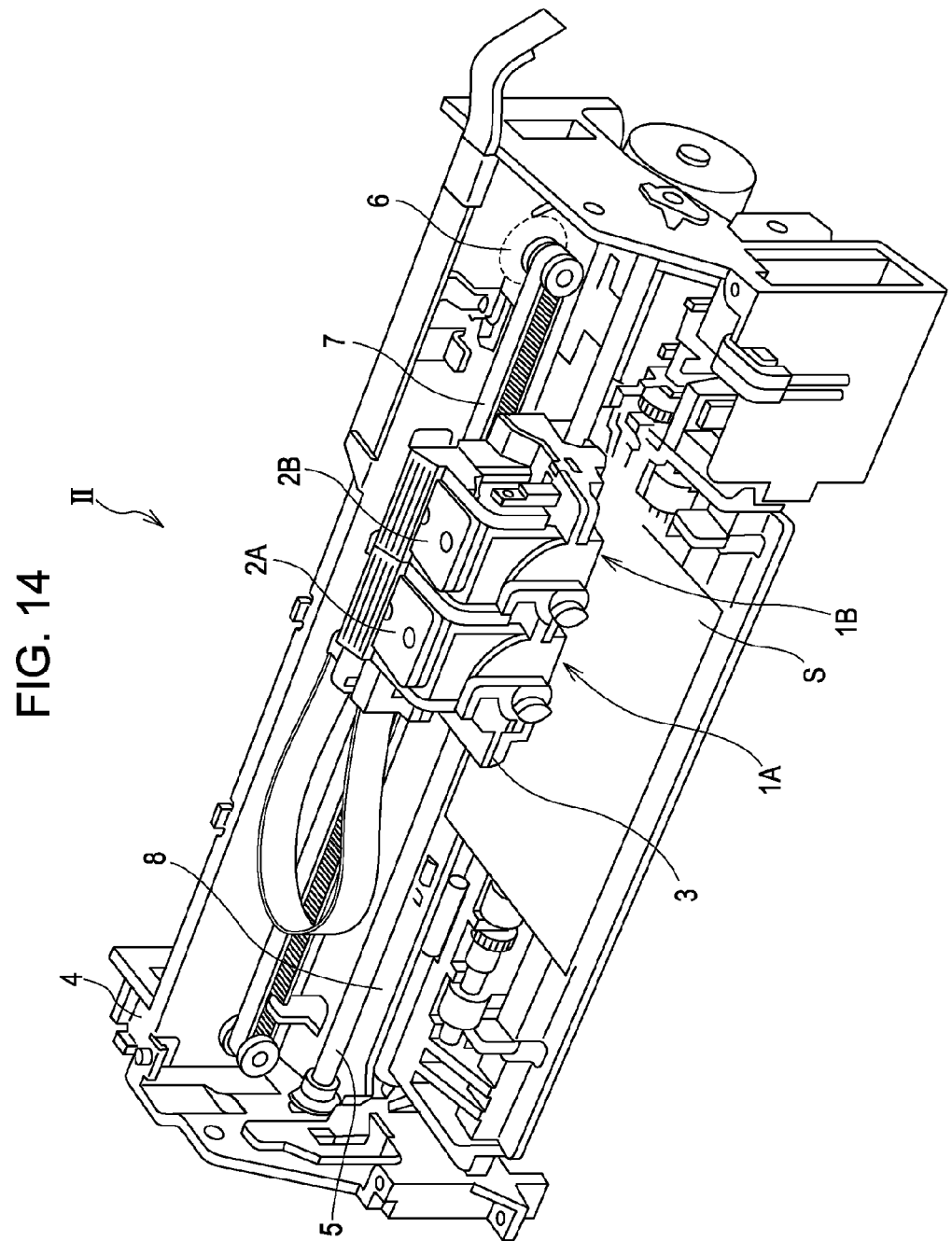
FIG. 14 is a schematic perspective view of a recording apparatus according to an embodiment of the invention.

The ink jet recording head according to an embodiment of the invention can be installed in an ink jet recording apparatus to serve as a part of a recording head unit including flow channels communicating with an ink cartridge or the like. FIG. 14 is a schematic perspective view of such an ink jet recording apparatus.

The ink jet recording apparatus II shown in FIG. 14 includes recording head units 1A and 1B each including the ink jet recording head I, and cartridges 2A and 2B for supplying ink are removably mounted in the respective recoding head units 1A and 1B. The recording head units 1A and 1B are loaded on a carriage 3 secured for movement along a carriage shaft 5 of an apparatus body 4. The recording head units 1A and 1B eject, for example, a black ink composition and a color ink composition, respectively.

The carriage 3 on which the recording head units 1A and 1B are mounted is moved along the carriage shaft 5 by transmitting a driving force from a driving motor 6 to the carriage 3 through a plurality of gears (not shown) and a timing belt 7. In the apparatus body 4, a platen 8 is disposed along the carriage shaft 5 so that a recording sheet S, which is a print medium such as a paper sheet, fed from, for example, a feed roller (not shown), is transported over the platen 8.

In the above ink jet recording apparatus II, ink jet recording heads I (head units 1A and 1B) mounted on a carriage 3 move in a main scanning direction. However, the ink jet recording apparatus is not limited to this type, and may be of the type of a so-called line recording apparatus in which, for example, printing is performed by only moving a recording sheet S, such as paper, in a sub-scanning direction with the ink jet recording head I fixed.

Although the above embodiment has described an ink jet recording head as the liquid ejecting head, the invention is intended for any type of liquid ejecting head, and may be applied to other liquid ejecting heads that eject liquid other than ink. Other liquid ejecting heads include various types of recording head used in image recording apparatuses such as printers, color material ejecting heads used for manufacturing color filters of liquid crystal displays or the like, electrode material ejecting heads used for forming electrodes of organic EL displays or field emission displays (FEDs), and bioorganic material ejecting heads used for manufacturing biochips.

The piezoelectric element of embodiments of the invention can be applied to ultrasonic oscillators and other ultrasonic wave devices, ultrasonic motors, pressure sensors, pyroelectric sensors, and other devices, without being limited to the piezoelectric element used in liquid ejecting heads represented by an ink jet recording head. Also, the piezoelectric element according to an embodiment of the invention may be applied to a ferroelectric element of a ferroelectric memory device or the like.

What is claimed is:

1. A piezoelectric element comprising:
   an insulating film made of zirconium oxide;
   an adhesion layer containing zirconium, disposed above the insulating film;
   a first electrode disposed directly on the adhesion layer;
   a piezoelectric layer made of a complex oxide containing bismuth, disposed above the first electrode; and
   a second electrode disposed above the piezoelectric layer,
   wherein the first electrode includes zirconium diffused from the adhesion layer and the adhesion layer includes partially oxidized bismuth diffused from the piezoelectric layer.

2. The piezoelectric element according to claim 1, wherein the adhesion layer contains zirconium and zirconium oxide.

3. The piezoelectric element according to claim 1, wherein the adhesion layer contains zirconium, zirconium oxide and bismuth.

4. A liquid ejecting head comprising the piezoelectric element as set forth in claim 1.

5. A liquid ejecting apparatus comprising the liquid ejecting head as set forth in claim 4.

6. The piezoelectric element according to claim 1, wherein the piezoelectric layer is made of a lead-free piezoelectric ceramic of a complex oxide having a perovskite structure, the complex oxide being selected from the group consisting of bismuth ferrate, bismuth ferrate manganate, bismuth sodium titanate, bismuth potassium titanate, and barium titanate.

* * * * *